(12) United States Patent
Iida et al.

(10) Patent No.: US 11,018,326 B2
(45) Date of Patent: May 25, 2021

(54) POLARIZING PLATE WITH OPTICAL COMPENSATION LAYER AND ORGANIC EL PANEL USING SAME

(71) Applicant: NITTO DENKO CORPORATION, Ibaraki (JP)

(72) Inventors: Toshiyuki Iida, Ibaraki (JP); Hironori Yaginuma, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 124 days.

(21) Appl. No.: 16/083,173

(22) PCT Filed: Mar. 6, 2017

(86) PCT No.: PCT/JP2017/008707
§ 371 (c)(1),
(2) Date: Sep. 7, 2018

(87) PCT Pub. No.: WO2017/154817
PCT Pub. Date: Sep. 14, 2017

(65) Prior Publication Data
US 2019/0103589 A1  Apr. 4, 2019

(30) Foreign Application Priority Data
Mar. 11, 2016  (JP) .............................. JP2016-048809

(51) Int. Cl.
*G02B 5/30* (2006.01)
*H01L 51/52* (2006.01)
(Continued)

(52) U.S. Cl.
CPC ........ *H01L 51/5293* (2013.01); *G02B 5/3025* (2013.01); *G02B 5/3033* (2013.01);
(Continued)

(58) Field of Classification Search
CPC .. G02B 5/3083; G02B 5/3025; G02B 5/3016; G02B 5/3033; G02B 5/30; G02B 5/3041;
(Continued)

(56) References Cited

U.S. PATENT DOCUMENTS 6,565,974 B1  5/2003 Uchiyama et al.
6,912,029 B2  6/2005 Tanaka
(Continued)

FOREIGN PATENT DOCUMENTS

CN  1841146 A  10/2006
CN  101548205 A  9/2009
(Continued)

OTHER PUBLICATIONS

Office Action dated Mar. 27, 2020, issued in counterpart CN Application No. 201780016532.6, with English translation (17 pages).
(Continued)

*Primary Examiner* — William R Alexander
*Assistant Examiner* — Ephrem Z Mebrahtu
(74) *Attorney, Agent, or Firm* — Westerman, Hattori, Daniels & Adrian, LLP

(57) ABSTRACT

There is provided a polarizing plate with optical compensation layers that is excellent in antireflection characteristic in an oblique direction while maintaining an excellent antireflection characteristic in a front direction, and that has a neutral hue in the oblique direction. A polarizing plate with optical compensation layers according to the present invention is used for an organic EL panel The polarizing plate with optical compensation layers according to an embodiment of the present invention includes in the following order: a polarizer; a first optical compensation layer; and a second optical compensation layer. The first optical compensation layer shows a refractive index characteristic of nx>nz>ny
(Continued)

and has an Re (550) of from 230 nm to 310 nm. The second optical compensation layer shows a refractive index characteristic of nx>nz>ny and satisfies a relationship of Re (450)<Re (550).

9 Claims, 1 Drawing Sheet

(51) Int. Cl.
  *H01L 51/50* (2006.01)
  *H05B 33/02* (2006.01)
  *G02B 1/14* (2015.01)
(52) U.S. Cl.
  CPC ........ *G02B 5/3083* (2013.01); *H01L 51/5012* (2013.01); *H01L 51/5275* (2013.01); *H05B 33/02* (2013.01); *G02B 1/14* (2015.01)
(58) Field of Classification Search
  CPC ........... G02F 1/13363; G02F 1/133634; G02F 1/133528
  See application file for complete search history.

(56) References Cited

U.S. PATENT DOCUMENTS

| | | |
|---|---|---|
| 6,961,180 B2 | 11/2005 | Umemoto |
| 7,336,330 B2 | 2/2008 | Tanaka |
| 7,440,056 B2 | 10/2008 | Kobayashi |
| 7,804,568 B2 | 9/2010 | Kobayashi |
| RE43,217 E | 2/2012 | Kobayashi |
| 8,154,694 B2 | 4/2012 | Bitou et al. |
| 9,627,655 B2 | 4/2017 | Yaginuma et al. |
| 2002/0089748 A1 | 7/2002 | Umemoto |
| 2004/0066482 A1 | 4/2004 | Tanaka |
| 2005/0219449 A1 | 10/2005 | Tanaka |
| 2006/0221281 A1 | 10/2006 | Kobayashi |
| 2007/0211199 A1* | 9/2007 | Kobayashi ........ G02F 1/133634 349/117 |
| 2009/0027602 A1 | 1/2009 | Kobayashi |
| 2010/0053510 A1 | 3/2010 | Bitou et al. |
| 2015/0249231 A1 | 9/2015 | Yaginuma et al. |
| 2017/0047555 A1* | 2/2017 | Ishiguro .............. H01L 51/5293 |

FOREIGN PATENT DOCUMENTS

| | | | |
|---|---|---|---|
| JP | 2002-148433 A | | 5/2002 |
| JP | 3325560 B2 | | 9/2002 |
| JP | 2003-35820 A | | 2/2003 |
| JP | 2003-332068 A | | 11/2003 |
| JP | 2008-134546 A | | 6/2008 |
| JP | 2008-139806 A | | 6/2008 |
| JP | 2008-165185 A | | 7/2008 |
| JP | 2008209613 A | * | 9/2008 |
| JP | 2008-242467 A | | 10/2008 |
| JP | 2008-256998 A | | 10/2008 |
| JP | 2009-251326 A | | 10/2009 |
| JP | 2015-106114 A | | 6/2015 |
| KR | 10-2009-0091743 A | | 8/2009 |
| TW | 200834135 A | | 8/2008 |
| TW | 201409095 A | | 3/2014 |

OTHER PUBLICATIONS

International Search Report dated May 23, 2017, issued in counterpart International Application No. PCT/JP2017/008707 (2 pages).
Office Action dated Oct. 16, 2020, issued in counterpart TW Application No. 106107723, with English translation (8 pages).
Saitoh, Yukito, "Optical Compensation Films and Polarizers", Handbook of Visual Display Technology, 2015, first online Jun. 8, 2015, pp. 1-11; Cited in TW Office Action dated Oct. 16, 2020.
Office Action dated Jun. 20, 2020, issued in counterpart TW Application No. 106107723, with English Translation. (11 pages).
Office Action dated Feb. 22, 2021, issued in counterpart KR Application No. 10-2018-7026053, with English Translation. (10 pages).

* cited by examiner

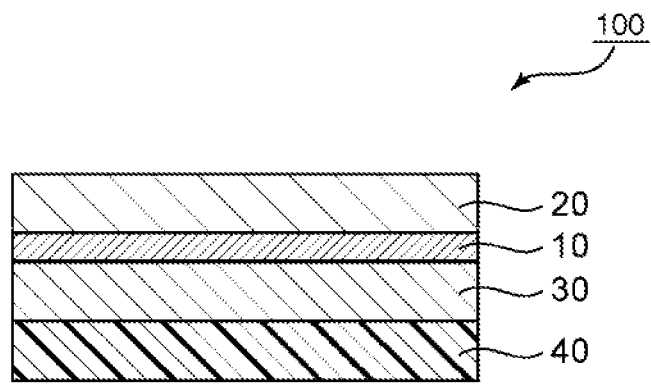

POLARIZING PLATE WITH OPTICAL COMPENSATION LAYER AND ORGANIC EL PANEL USING SAME

TECHNICAL FIELD

The present invention relates to a polarizing plate with optical compensation layers and an organic EL panel using the same.

BACKGROUND ART

In recent years, along with widespread use of thin displays, a display having an organic EL panel mounted thereon (organic EL display apparatus) has been proposed. The organic EL panel has a metal layer having high reflectivity, and hence is liable to cause a problem of, for example, reflection of ambient light or reflection of a background. In view of the foregoing, it has been known that such problem is prevented by arranging a circularly polarizing plate on a viewer side. A circularly polarizing plate in which a retardation film (typically a λ/4 plate) is laminated so that its slow axis may form an angle of about 45° with regard to the absorption axis of a polarizer has been known as a general circularly polarizing plate. In addition, an attempt has been made to laminate retardation films (optical compensation layers) having various optical characteristics for further improving an antireflection characteristic of the circularly polarizing plate. However, conventional circularly polarizing plates each involve a problem in that a reflectance in an oblique direction is large (i.e., an antireflection characteristic in the oblique direction is insufficient). Further, the conventional circularly polarizing plates each involve a problem in that a hue in the oblique direction undergoes undesired coloring.

CITATION LIST

Patent Literature

[PTL 1] JP 3325560 B2

SUMMARY OF INVENTION

Technical Problem

The present invention has been made to solve the above-mentioned conventional problems, and a primary object of the present invention is to provide a polarizing plate with optical compensation layers that is excellent in antireflection characteristic in an oblique direction while maintaining an excellent antireflection characteristic in a front direction, and that has a neutral hue in the oblique direction.

Solution to Problem

A polarizing plate with optical compensation layers according to an embodiment of the present invention includes in the following order: a polarizer; a first optical compensation layer; and a second optical compensation layer. The first optical compensation layer shows a refractive index characteristic of nx>nz>ny and has an Re (550) of from 230 nm to 310 nm. The second optical compensation layer shows a refractive index characteristic of nx>nz>ny and satisfies a relationship of Re (450)<Re(550). The polarizing plate with optical compensation layers is used in an organic EL panel. Here, Re(450) and Re(550) represent in-plane retardations measured at 23° C. with light having a wavelength of 450 nm and light having a wavelength of 550 nm, respectively.

In one embodiment of the present invention, the first optical compensation layer has an Nz coefficient of from 0.1 to 0.4, an absorption axis direction of the polarizer and a slow axis direction of the first optical compensation layer are substantially perpendicular to each other, and an angle formed by an absorption axis of the polarizer and a slow axis of the second optical compensation layer is from 35° to 55°. In another embodiment of the present invention, the first optical compensation layer has an Nz coefficient of from 0.6 to 0.9, an absorption axis direction of the polarizer and a slow axis direction of the first optical compensation layer are substantially parallel to each other, and an angle formed by an absorption axis of the polarizer and a slow axis of the second optical compensation layer is from 35° to 55°.

In one embodiment of the present invention, the second optical compensation layer has an Re(550) of from 100 nm to 180 nm and an Nz coefficient of from 0.3 to 0.7.

According to another aspect of the present invention, there is provided an organic EL panel. The organic EL panel includes the polarizing plate with optical compensation layers as described above.

Advantageous Effects of invention

According to the present invention, in the polarizing plate with optical compensation layers, the first optical compensation layer showing a refractive index characteristic of nx>nz>ny and having a predetermined in-plane retardation, and the second optical compensation layer showing a refractive index characteristic of nx>nz>ny and showing revere wavelength dispersion characteristic are arranged in the stated order from a polarizer side. Accordingly, the polarizing plate with optical compensation layers that is excellent in antireflection characteristic in an oblique direction while maintaining an excellent antireflection characteristic in a front direction, and that has a neutral hue in the oblique direction can be obtained.

BRIEF DESCRIPTION OF DRAWINGS

FIG. 1 is a schematic sectional view of a polarizing plate with optical compensation layers according to one embodiment of the present invention.

DESCRIPTION OF EMBODIMENTS

Preferred embodiment S of the present invention are described below. However, the present invention is not limited to these embodiments.

(Definitions of Terms and Symbols)

The definitions of terms and symbol; used herein are as described below.

(1) Refractive Indices (nx, ny, and, nz)

"nx" represents a refractive index in a direction in which an in-plane refractive index is maximum (that is, slow axis direction), "ny" represents a refractive index in a direction perpendicular to the slow axis in the plane (that fast axis direction), and "nz" represents a refractive index in a thickness direction.

(2) In-Plane Retardation (Re)

"Re($\lambda$)" raters to an in-plane retardation measured at 23° C. with light having a wavelength of $\lambda$ nm. The Re ($\lambda$) is determined from the equation "Re=(nx−ny)×d" when the thickness of a layer (film) is represented by d (nm). For example, "Re(550)" refers to an in-plane retardation measured at 23° C. with light having a wavelength of 550 nm
(3) Thickness Direction Retardation (Rth)

"Rth(λ)" refers to a thickness direction retardation measured at 23° C. with light having a wavelength of λ nm. The Rth(λ) determined from the equation "Rth=(nx−nz)×d" when the thickness of a layer (film) is represented by d (nm) For example, "Rth(550)" refers to a thickness direction retardation measured at 23° C. with light having a wavelength of 550 nm.
(4) Nz Coefficient An Nz coefficient is determined from the equation "Nz=Rth/Re".
(5) Substantially Perpendicular or Parallel The expressions "substantially perpendicular" and "approximately perpendicular" include a case in which an angle formed by two directions is 90°±10°, and the angle is preferably 90°±7°, more preferably 90°±5°. The expressions "substantially parallel" and "approximately parallel" include a case in which an angle formed by two directions is 0°±10°, and the angle is preferably 0°±7°, more preferably 0°±5°. Moreover, the simple expression "perpendicular" or "parallel" as used herein may include a substantially perpendicular state or a substantially parallel state.

A. Overall Configuration of Polarizing Plate with Optical Compensation Layers

FIG. 1 is a schematic sectional view of a polarizing plate with optical compensation layers according to one embodiment of the present invention. A polarizing plate 100 with optical compensation layers according to this embodiment includes a polarizer 10, a first optical compensation layer 30, and a second optical compensation layer 40 in the stated order in practical use, a protective layer 20 maybe arranged on the side of the polarizer 10 opposite to the first optical compensation layer 30 like the illustrated example In addition, the polarizing plate with optical compensation layers may include another protective layer (also referred to as "inner protective layer") between the polarizer 10 and the first optical compensation layer 30. In the illustrated example, the inner protective layer is omitted. In this case, the first optical compensation layer 30 may also function as an inner protective layer With such configuration, further thinning of the polarizing plate with optical compensation layers can be achieved. Further, a conductive layer and a substrate (none of which is shown) may be arranged on the side of the second optical compensation layer 40 opposite to the first optical compensation layer 30 (i.e., outside the second optical compensation layer 40) in the stated order as required. The substrate is laminated so as to be in close contact with the conductive layer. The phrase "laminated so as to be in close contact" as used herein means that two layers are laminated directly and fixedly without an adhesion layer (e.g., an adhesive layer or a pressure-sensitive adhesive layer) being interposed. The conductive layer and the substrate may be typically introduced as a laminate of the substrate and the conductive layer into the polarizing plate 100 with optical compensation layers. When the conductive layer and the substrate are further arranged, the polarizing plate 100 with optical compensation layers can be suitably used for an inner touch panel-type input display apparatus.

The refractive index characteristic of the first optical compensation layer 30 shows a relationship of nx>nz>ny, and the layer has a slow axis. The in-plane retardation Re (550) of the first optical compensation layer 30 is from 230 nm to 310 nm. In one embodiment, the Nz coefficient of the first optical compensation layer is preferably from 0.1 to 0.4. In this case, the slow axis of the first optical compensation layer 30 and the absorption axis of the polarizer 10 are substantially perpendicular to each other. In another embodiment, the Nz coefficient of the first optical compensation layer is preferably from 0.6 to 0.9. In this case, the slow axis of the first optical compensation layer 30 and the absorption axis of the polarizer 10 are substantially parallel to each other. The refractive index characteristic of the second optical compensation layer 40 shows a relationship of nx>nz>ny and the layer has a slow axis. An angle formed by the slow axis of the second optical compensation layer 40 and the absorption axis of the polarizer 10 is preferably from 35° to 55°, more preferably from 38° to 52°, still more preferably from 42° to 48°, particularly preferably about 45°. When the angle falls within such range, an excellent antireflection function can be achieved. The second optical compensation layer 40 satisfies a relationship of Re (450) <Re (550), and its in-plane retardation Re (550) is preferably from 100 nm to 180 nm. As described above, when the first optical compensation layer showing a refractive index characteristic of nx>nz>ny and having a predetermined in-plane retardation, and the second optical compensation layer showing a refractive index characteristic of nx>nz>ny and showing revere wavelength dispersion characteristic are arranged in the stated order from a polarizer side, light leakage or the like due to an apparent axis shift of the absorption axis of the polarizer when viewed from an oblique direction is prevented while an excellent antireflection characteristic of the polarizing plate with optical compensation layers in a front direction by virtue of an excellent circular polarization function thereof is maintained. Accordingly, an excellent antireflection characteristic can be achieved in the oblique direction, and a hue that is neutral (i.e., free of undesired coloring) can be achieved in the oblique direction.

Each layer and each optical film forming the polarizing plate with optical compensation layers are described in detail below.

A-1. Polarizer

Any appropriate polarizer may be adopted as the polarizer 10. For example, a resin film forming the polarizer may be a single-layer resin film, or may be a laminate of two or more layers.

Specific examples of the polarizer including a single layer resin film include: a polarizer obtained by subjecting a hydrophilic polymer film, such as a polyvinyl alcohol (PVA)-based film, a partially formalized PVA-based film, or an ethylene-vinyl acetate copolymer-based partially saponified film, to dyeing treatment with a dichroic substance, such as iodine or a dichroic dye, and stretching treatment; and a polyene-based alignment film, such as a dehydration-treated product of PVA or dehydrochlorination-treated product of polyvinyl chloride. A polarizer obtained by dyeing the PVA-based film with iodine and uniaxially stretching the resultant is preferably used because the polarizer is excellent in optical characteristics.

The dyeing with iodine is performed by, for example, immersing the PVA-based film in an aqueous solution of iodine. The stretching ratio of the uniaxial stretching is preferably from 3 times to 7 times. The stretching may be performed after the dyeing treatment, or may be performed while the dyeing is performed. In addition, the dyeing may be performed after the stretching has been performed. The PVA-based film is subjected to swelling treatment, cross-linking treatment, washing treatment, drying treatment, or the like as required. For example, when the PVA-based film is immersed in water to be washed with water before the dyeing, contamination or an antiblocking agent on the surface of the PVA-based film can be washed off. In addition, the PVA-based film is swollen and hence dyeing unevenness or the like can be prevented.

The polarizer obtained by using the laminate is specifically, for example, a polarizer obtained by using a laminate of a resin substrate and a PVA-based resin layer (PVA-based resin film) laminated on the resin substrate, or a laminate of a resin substrate and a PVA-based resin layer formed on the resin substrate through application. The polarizer obtained by using the laminate of the resin substrate and the PVA-based resin layer formed on the resin substrate through application may be produced by, for example, a method involving: applying a PVA-based resin solution onto the resin substrate; drying the solution to form the PVA-based resin layer on the resin substrate, thereby providing the laminate of the resin substrate and the PVA-based resin layer; and stretching and dyeing the laminate to turn the PVA-based resin layer into the polarizer. In this embodiment, the stretching typically includes the stretching of the laminate under a state in Which the laminate is immersed in an aqueous solution of boric acid. The stretching may further include the in-air stretching of the laminate at high temperature (e.g., 95° C. or more) before the stretching in the aqueous solution of boric acid as required. The resultant laminate of the resin substrate and the polarizer may be used as it is (i.e., the resin substrate may be used as a protective layer for the polarizer). Alternatively, a product obtained as described below may be used: the resin substrate is peeled from the laminate of the resin substrate and the polarizer, and any appropriate protective layer in accordance with purposes is laminated on the peeling surface. The details of such method of producing a polarizer are described in, for example, JP 2012-73580 A, the description of which is incorporated herein by reference in its entirety.

The thickness of the polarizer is preferably 25 μm or less, more preferably from 1 μm to 12 μm, still more preferably from 3 μm to 12 μm, particularly preferably from 3 μm to 8 μm. When the thickness of the polarizer falls within such range, curling at the time of heating can be satisfactorily suppressed, and satisfactory appearance durability at the time of heating is obtained.

The polarizer preferably shows absorption dichroism at any wavelength in the wavelength range of from 380 nm to 780 nm. The single layer transmittance of the polarizer is preferably from 42.0% to 46.0%, more preferably from 44.5% to 46.0% The polarization degree of the polarizer is preferably 97.0% or more, more preferably 99.0% or more, still more preferably 99.9% or more.

A-2. First Optical Compensation Layer

As described above, the refractive index characteristic of the first optical compensation layer 30 shows a relationship of nx>nz>ny. The in-plane retardation Re(550) of the first optical compensation layer is from 230 nm to 310 nm, preferably from 240 nm to 300 nm, more preferably from 260 nm to 280 nm. When the in-plane retardation of the first optical compensation layer falls within such range, a reduction in antireflection function of the polarizing plate with optical compensation layers in the oblique direction resulting from the apparent axis shift of the absorption axis of the polarizer can be prevented by making the slow axis direction of the first optical compensation layer substantially perpendicular or parallel to the absorption axis direction of the polarizer in accordance with the Nz coefficient of the first optical compensation layer as described above.

In one embodiment, the Nz coefficient of the first optical compensation layer is preferably from 0.1 to 0.4, more preferably from 0.2 to 0.3, still more preferably from 0.23 to 0.27. In another embodiment, the Nz coefficient is preferably from 0.6 to 0.9, more preferably from 0.7 to 0.8, still more preferably from 0.73 to 0.77. When the Nz coefficient falls within such range, a more excellent antireflection characteristic in the oblique direction can be achieved by adjusting an angle formed by the slow axis of the first optical compensation layer and the absorption axis of the polarizer to a predetermined angle.

The first optical compensation layer may show such a reverse wavelength dispersion characteristic that its retardation value increases in accordance with an increase in wavelength measurement light, may show such a positive wavelength dispersion characteristic that the retardation value reduces in accordance with the increase in wavelength of the measurement light, or may show such a flat wavelength dispersion characteristic that the retardation value hardly changes even when the wavelength of the measurement light changes.

The first optical compensation layer is typically a retardation film formed of any appropriate resin that can achieve the above-mentioned characteristic. Examples of the resin forming the retardation film include polyarylate, polyamide, polyimide, polyester, polyaryletherketone, polyamide-imide, polyester imide polyvinyl alcohol, polyfumarate, polyethersulfone, polysulfone, a norbornene resin, a polycarbonate resin, a cellulose resin, and polyurethane. Those resins may be used alone or in combination thereof. Of those, polyarylate or a polycarbonate resin is preferred, and a polycarbonate resin or polyarylate represented by the following formula (I) is more preferred.

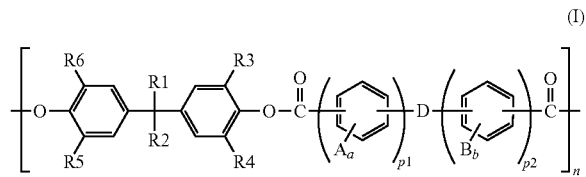

(I)

In the formula (I): A and B each represent a substituent specifically a halogen atom, an alkyl group having 1 to 6 carbon atoms, of a substituted or unsubstituted aryl group, and A and B may be identical to or different from each other; a and b represent the numbers of substitutions with A and B, respectively, and each represent an integer of from 1 to 4; D represent,s a covalent bond, a $CH_2$ group, a $C(CH_3)_2$ group, a $C(CZ_3)_2$ group where Z represents a halogen atom, a CO group, an 0 atom, a S atom, a $SC_2$ group, a Si $(CH_2CH_3)_2$ group, or a N $(CH_3)$ group; R1 represents a linear or branched alkyl group having 1 to 10 carbon atoms, or a substituted or unsubstituted aryl group; R2 represents a linear or branched alkyl group having 2 to 10 carbon atoms, or a substituted or unsubstituted aryl group; R3, R4, R5, and R6 each independently represent a hydrogen atom or a linear or branched alkyl group having 1 to 4 carbon atoms, and R3, R4, R5, and R6 may be identical to or different from each other; and p1 represents an integer of from 0 to 3, p2 represents an integer of from 1 to 3, and n represents an integer of 2 or more.

The first optical compensation layer may be formed by, for, example, dissolving or dispersing the resin in any appropriate solvent to prepare an application liquid, applying the application liquid to a shrinkable film to form an applied film, and shrinking the applied film. Typically, the shrinkage of the applied film is performed as follows: a laminate of the shrinkable film and the applied film is heated to shrink the shrinkable film, and the applied film is shrunk by such shrinkage of the shrinkable film. The shrinkage ratio of the applied film is preferably from 0.50 to 0.99, more preferably from 0.60 to 0.98, still more preferably from 0.70 to 0.95. A heating temperature is preferably from 130° C. to 170° C., more preferably from 150° C. to 160° C. In one embodiment, at the time of the shrinkage of the applied film, the laminate may be stretched in a direction perpendicular to the direction in which the applied film is shrunk. In this case, the stretching ratio of the laminate is preferably from 1.01 times to 3.0 times, more preferably from 1.05 times to 2.0 times, still more preferably from 1.10 times to 1.50 times. Specific examples of a material forming the shrinkable film include polyolefin, polyester, an acrylic resin, polyamide, polycarbonate, a norbornene resin, polystyrene, polyvinyl chloride, polyvinylidene chloride, a cellulose resin, polyethersulfone, polysulfone, polyimide, polyacryl, an acetate resin, polyarylate, polyvinyl alcohol, and a liquid crystal polymer. Those materials may be used alone or in combination thereof. The shrinkable film is preferably a stretched film formed from any such material.

The thickness of the first optical compensation layer is preferably from 10 μm to 150 μm, more preferably from 10 μm to 50 μm, still more preferably from 10 μm to 30 μm. With much thickness, the desired in-plane retardation and the desired Nz coefficient can be obtained.

A-3. Second Optical Compensation Layer

As described above, the refractive index characteristic of the second optical compensation layer 40 shows a relationship of nx>nz>ny. The in-plane retardation Re (550) of the second optical compensation layer is preferably from 100 nm to 180 nm, more preferably from 110 nm to 170 nm, still more preferably from 120 nm to 160 nm, particularly preferably from 130 nm to 150 nm. When the in-plane retardation of the second optical compensation layer falls within such range, an excellent antireflection characteristic can be achieved by setting the slow axis direction of the second optical compensation layer so that the direction may form an angle of from 35° to 55° (in particular, about 45°) with respect to the absorption axis direction of the polarizer as described above.

As described above, the second optical compensation layer shows a reverse wavelength dispersion characteristic. Specifically, its in-plane retardations satisfy a relationship of Re (450)<Re (550) Further, the in-plane retardations of the second optical compensation layer preferably satisfy a relationship of Re (550)<Re (650). As described above, when the second optical compensation layer that has a refractive index characteristic showing a relationship of nx>nz>ny and shows a revere wavelength dispersion characteristic is adopted in a circularly polarizing plate for an organic EL panel, a neutral hue can be achieved in the oblique direction. A ratio "Re (450)/Re (550)" is preferably 0.8 or more and less than 1, more preferably 0.8 or more and 0.95 or less. A ratio "Re (550)/Re (650)" is preferably 0.8 or more and less than 1, more preferably 0.8 or more and 0.95 or less. When such relationships are satisfied, a more excellent reflection hue can be achieved.

The Nz coefficient of the second optical compensation layer is preferably from 0.3 to 0.7, more preferably from 0.4 to 0.6, still more preferably from 0.45 to 0.55, particularly preferably about 0.5. When the Nz coefficient falls within such range, a more excellent reflection hue can be achieved.

The absolute value of the photoelastic coefficient of the second optical compensation layer is preferably $2\times10^{-12}$ (m²/N) or more, more preferably from $10\times10^{-12}$ (m²/N) to $100\times10^{-12}$ (m²/N) still more preferably from $20\times10^{-12}$ (m²/N) to $40\times10^{-12}$ (m²/N). When the absolute value of the photoelastic coefficient falls within such range, even in the case where the layer has a small thickness, the bending property of an organic EL panel can be maintained while a sufficient retardation is secured. Further, a change in retardation of the layer due to a stress at the time of its bending (consequently, a change in color of the organic EL panel) can be further suppressed.

The water absorption ratio of the second optical compensation layer is preferably 3% or less, more preferably 2.5% or less, still more preferably 2% or less. When such water absorption ratio is satisfied, changes in display characteristics of an organic EL panel, to be obtained with time can be suppressed. The water absorption ratio may be determined in conformity with JIS K 7209.

The second optical compensation layer preferably has barrier properties against moisture and a gas (e.g., oxygen) The water vapor permeability (moisture permeability) of the optical compensation layer under the conditions of 40° C. and 90%RH is preferably less than $1.0\times10^{-1}$ g/m²/24 hr. From the viewpoint of a barrier property against moisture, a lower limit for the moisture permeability is preferably as low as possible. The gas barrier property of the optical compensation layer under the conditions of 60° C. and 90%RH is preferably from $1.0\times10^{-7}$ g/m²/24 hr to 0.5 g/m²/24 hr, more preferably from $10\times10^{-7}$ g/m²/24 hr to 0.1 g/m²/24 hr. When the moisture permeability and the gas barrier property fall within such ranges, in the case where the polarizing plate with optical compensation layers is bonded to an organic EL panel, the organic EL panel can be satisfactorily protected from moisture and oxygen in air. Each of the moisture permeability and the gas barrier property may be measured in conformity with JIS K 7126-1.

The glass transition temperature (Tg) of the second optical compensation layer is preferably 120° C. or more. A lower limit for the glass transition temperature is more preferably 125° C. or more, still more preferably 130° C. or more, particularly preferably 135° C. or more. Meanwhile, an upper limit for the glass transition temperature is preferably 180° C. or less, more preferably 165° C. or less. When the glass transition temperature is excessively low, the heat resistance of the layer tends to deteriorate, and hence the dimensional change of the layer serving as a film may occur after its forming. In addition, the image quality of an organic EL panel to be obtained may be lowered. When the glass transition temperature is excessively high, forming stability at the time of the forming of the film may deteriorate, or the transparency of the film may be impaired. The glass transition temperature is determined in conformity with JIS K 7121 (1987).

The second optical compensation layer is typically a retardation film formed of any appropriate resin that can achieve the characteristics. Examples of the resin forming the retardation film include polyarylate, polyimide, polyamine, polyester, polyvinyl alcohol, polyfumarate, a norbornene resin, a polycarbonate resin, a cellulose resin, and polyurethane. Those resins may be used alone or in combination thereof. Of those, a polycarbonate resin or a cellulose resin is preferred.

The second optical compensation layer may be formed by, for example, dissolving or dispersing the resin in any appropriate solvent to prepare an application liquid, applying the application liquid to a shrinkable film to form an applied film, and shrinking the applied film. Typically, the shrinkage of the applied film is performed as follows: a laminate of the shrinkable film and the applied film is heated to shrink the shrinkable film, and the applied film is shrunk by such shrinkage of the shrinkable film. The shrinkage ratio of the applied film is preferably from 0.50 to 0.99, more preferably from 0.60 to 0.98, still more preferably from 0.70 to 0.95. A heating temperature is preferably from 130° C. to 170° C., more preferably from 150° C. to 160° C. In one embodiment, at the time of the shrinkage of the applied film, the laminate may be stretched in a direction perpendicular to the direction in which the applied film is shrunk. In this case, the stretching ratio of the laminate is preferably from 1.01 times to 3.0 times, more preferably from 1.05 times to 2.0 times, still more preferably from 1.10 times to 1.50 times. Specific examples of a material constituting the shrinkable film include polyolefin, polyester, an acrylic resin, polyamide, polycarbonate, a norbornene resin, polystyrene, polyvinyl chloride, polyvinylidene chloride, a cellulose resin, polyethersulfone, polysulfone, polyimide, polyacryl, an acetate resin, polyarylate polyvinyl alcohol, and a liquid crystal polymer. Those materials may be used alone or in combination thereof. The shrinkable film is preferably a stretched film formed from any such material Alternatively, the optical compensation layer may be formed by bonding the shrinkable film to one surface, or each of both surfaces, of a film formed of the resin with, for example, an acrylic pressure-sensitive adhesive, and then heating the resultant laminate to shrink the laminate.

The thickness of the second optical compensation layer is preferably from 10 μm to 150 μm. In one embodiment, the thickness is more preferably from 10 μm to 50 μm, still more preferably from 10 μm to 30 μm. In another embodiment, the thickness is more preferably from 20 μm to 70 μm, still more preferably from 30 μm to 60 μm. With such thickness, the desired in-plane retardation and the desired Nz coefficient can be obtained.

A-4. Protective Layer

The protective layer 20 is formed of any appropriate film that may be used as a protective layer for a polarizer. Material serving as a main component of the film is specifically, for example: a cellulose-based resin, such as triacetylcellulose (TAC); a transparent resin, such as a polyester-based, polyvinyl alcohol-based, polycarbonate-based, polyamide-based, polyimide-based, polyethersulfone-based, polysulfone-based, polystyrene-based, polynorbornene-based; polyolefin-based, (meth) acrylic, or acetate-based transparent resin; or a thermosetting resin or a UV-curable resin, such as a(meth) acrylic, urethane-based, (meth)acrylic urethane-based, epoxy-based, or silicone-based thermosetting resin or UV-curable resin. A further example thereof is a glassy polymer, such as a siloxane-based polymer. In addition, a polymer film described in JP 2001-343529 A (WO 01 /37007 A1) may be used. For example, a resin composition containing a thermoplastic resin having a substituted or unsubstituted imide group on a side chain thereof, and a thermoplastic resin having a substituted or unsubstituted phenyl group and a nitrile group on side chains thereof may be used as the material for the film, and the composition is, for example, a resin composition containing an alternating copolymer formed of isobutene and N-methylmaleimide, and an acrylonitrile-styrene copolymer. The polymer film may be, for example, an extrudate of the resin composition.

The protective layer 20 may be subjected to surface treatment, such as hard coat treatment, antireflection treatment, anti-sticking treatment, or antiglare treatment, as required. Further/alternatively, the protective layer 20 may be subjected to treatment for improving viewability when the display screen of an image display apparatus is viewed through polarized sunglasses (typically the impartment of a circular (elliptical) polarization function or the impartment of an ultra-high retardation) as required. When any such treatment is performed, even in the case where the display screen is viewed through a polarizing lens, such as polarized sunglasses, excellent viewability can be achieved. Therefore, the polarizing plate with optical compensation layers is suitably applicable even to an image display apparatus that may be used outdoors.

The thickness of the protective layer 20 is typically 5 mm or less, preferably 1 mm or less, more preferably from 1 μm to 500 μm, still more preferably from 5 μm to 150 μm. When the protective layer is subjected to surface treatment, its thickness is a thickness including the thickness of a surface-treated layer.

When an inner protective layer is arranged between the polarizer 10 and the first optical compensation layer 30, it is preferred that the inner protective layer be optically isotropic. The phrase "optically isotropic" as used herein means that the layer has an in-plane retardation Re(550) of from 0 nm to 10 nm and a thickness direction retardation Rth(550) of from −10 nm to +10 nm. The inner protective layer maybe composed of any appropriate material as long as the layer is optically isotropic. The material may be appropriately selected from, for example, the materials described above for the protective layer 20.

The thickness of the inner protective layer is preferably from 5 μm to 200 μm, more preferably from 10 μm to 100 μm, still more preferably from 15 μm to 95 μm.

A-5. Conductive Layer or Conductive Layer with Substrate

The conductive layer may be formed by forming a metallic oxide film on any appropriate substrate through any appropriate film forming method (e.g., a vacuum vapor deposition method, a sputtering method, a CVD method, an ion plating method, and a spraying method). After the film formation, heating treatment (e.g., at from 100° C. to 200° C.) may be performed as required. When the heating treatment is performed, an amorphous film can be crystallized. Examples of the metal oxide include indium oxide, tin oxide, zinc oxide, indium-tin composite oxide, tin-antimony composite oxide, zinc-aluminum composite oxide, and indium-zinc composite oxide. An indium oxide may be doped with a divalent metal ion or a tetravalent metal ion. The metal oxide is preferably an indium-based composite oxide, more preferably indium-tin composite oxide (ITO) The indium-based composite oxide has features of having a high transmittance (e.g., 80% or more) in a visible region (380 nm to 780 nm) and having a low surface resistance value per unit area.

When the conductive layer contains the metal oxide, the thickness of the conductive layer is preferably 50 nm or less, more preferably 35 nm or less. The lower limit of the thickness of the conductive layer is preferably 10 nm.

The surface resistance value of the conductive layer is preferably 300 ohms per square (Ω/□) or less, more preferably 150 Ω/□ or less, still more preferably 100 Ω/□ or less.

The conductive layer may be transferred from the substrate onto the fourth optical compensation layer to serve alone as a layer included in the polarizing plate with optical compensation layers, or may be laminated as a laminate with the substrate (conductive layer with a substrate) on the fourth optical compensation layer. Typically, as described above, the conductive layer and the substrate may be introduced as a conductive layer with a substrate into the polarizing plate with optical compensation layers.

Any appropriate resin is given as a material forming the substrate. The resin is preferably a resin excellent in transparency. Specific examples thereof include a cyclic olefin-based resin, a polycarbonate-based resin, a cellulose-based resin, a polyester-based resin, and an acrylic resin.

It is preferred that the substrate be optically isotropic. Therefore, the conductive layer can be used as a conductive layer with an isotropic substrate in the polarizing plate with optical compensation layers. A material forming the substrate that is optically isotropic (isotropic substrate) is, for example, material using a resin free of any conjugated system, such as a norbornene-based resin or an olefin-based resin, as a main skeleton, or a material having a cyclic structure, such as a lactone ring or a glutarimide ring, in the main chain of an acrylic resin. The use of any such material can suppress the expression of a retardation in association with the orientation of the molecular chain of the material at the time of the formation of the isotropic substrate to a low level.

The substrate has a thickness of preferably from 10 µm to 200 µm, more preferably from 20 µm to 60 µm.

A-6. Others

Any appropriate pressure-sensitive adhesive layer or adhesive layer is used in the lamination of the respective layers constituting the polarizing plate with optical compensation layers of the present invention. The pressure-sensitive adhesive layer is typically formed of an acrylic pressure-sensitive adhesive. The adhesive layer is typically formed of a polyvinyl alcohol-based adhesive.

A pressure-sensitive adhesive layer may be arranged on the second optical compensation layer 40 side of the polarizing plate 100 with optical compensation layers, though the layer is not shown. When the pressure-sensitive adhesive layer is arranged in advance, the polarizing plate with optical compensation layers can be easily bonded to any other optical member (e.g., an organic EL cell). A release film is preferably bonded to the surface of the pressure-sensitive adhesive layer until the polarizing plate with optical compensation layers is used.

B. Organic EL Panel

An organic EL panel of the present invention includes an organic EL cell and the polarizing plate with optical compensation layers described in the section A on the viewer side of the organic EL cell. The polarizing plate with optical compensation layers is laminated so that the second optical compensation layer may be on an organic EL cell side (the polarizer may be on the viewer side).

EXAMPLES

Now, the present invention is specifically described by way of Examples. However, the present invention is not limited by these Examples. Measurement methods for characteristics are as described below.

(1) Thickness

Measurement was performed with a dial gauge (manufactured by PEACOCK, product name: "DG-205", dial gauge stand (product name: "pds-2").

(2) Retardation

A sample measuring 50 mm by 50 mm was cut out of each optical compensation layer to provide a measurement sample, and its retardation values were measured with AxoScan manufactured by Axometrics, Inc. Measurement wavelengths were 450 nm and 550 nm, and a measurement temperature was 2.3° C.

In addition, the average refractive indices of the sample were measured with an Abbe refractometer manufactured by Atago Co., Ltd., and its refractive indices nx, ny, and nz were calculated from the resultant retardation values.

(3) Reflection Characteristic in Oblique Direction

A simulation was performed by using the characteristics of polarizing plates with optical compensation layers obtained in Examples and Comparative Examples. Evaluations were performed for a front direction (polar angle: 0°) and an oblique direction (polar angle: 60°). "LCD MASTER Ver. 6.084" manufactured by Shintech, Inc. was used in the simulation. The simulation of reflection characteristics was performed by using the extended function of the LCD Master. In more detail, a front reflection intensity, a front reflection hue, an oblique reflection intensity, and an oblique reflection hue were evaluated. The oblique reflection intensity was evaluated in terms of the average of values measured at a polar angle of 60° and four azimuth angles, that is, 45°, 135°, 225°, and 315°. The front reflection hue was evaluated in term of $\Delta u'v'$ (neutral) from a neutral point, and the oblique reflection hue was evaluated in terms of a color shift $\Delta u'v'$ at a polar angle of 60° and an azimuth angle of from 0° to 360°.

Example 1

(i) Production of First Optical Compensation Layer (i-1) Synthesis of Polyarylate 27.0 kg of 2,2-bis (4-hydroxyphenyl) -4-methylpentane and 0.8 kg of tetrabutylammonium chloride were dissolved in 250 L of a sodium hydroxide solution in a reaction vessel equipped with a stirring apparatus. To the stirred solution, a solution obtained by dissolving 13.5 kg of terephthaloyl chloride and 6.30 kg of isophthaloyl chloride in 300 L of toluene was added all at once, followed by stirring at room temperature for 90 minutes. Thus, a polycondensation solution was obtained. After that, the polycondensation solution was separated by being left to stand still to separate a toluene solution containing polyarylate. Next, the separated liquid was washed with aqueous acetic acid and further washed with ion-exchanged water. After that, the washed product was loaded into methanol to precipitate the polyarylate. The precipitated polyarylate was filtered and dried under reduced pressure to provide 34.1 kg of white polyarylate (yield: 92%). The birefringent index ($\Delta n_{xz}$) of the polyarylate was 0.012.

(i-2) Production of Retardation Layer

An application liquid was prepared by dissolving 10 kg of the polyarylate obtained in the foregoing in 73 kg of toluene. After that, the application liquid was directly applied onto a shrinkable film (longitudinally uniaxially stretched polypropylene film, manufactured by Tokyo Printing Ink Mfg. Co., Ltd., product name: "NOBLEN"), and the applied film was dried at a drying temperature of 60° C. for 5 minutes and then at a drying temperature of 80° C. for 5 minutes to form a laminate of the shrinkable film and a birefringent layer. The resultant laminate was stretched with a simultaneous biaxial stretching machine at a stretching temperature of 155° C. in its MD direction at a shrinkage ratio of 0.70 and in its TD direction at 1.15 times. Thus, a retardation film was formed on the shrinkable film. Next, the retardation film was peeled from the shrinkable film. The retardation film had a thickness of 15.0 µm, an Re (550) of 272 nm, and an Nz coefficient of 0.25. The retardation film was used as a first optical compensation layer.

(ii) Production of Second Optical Compensation Layer

Polymerization was performed by using a batch polymerization apparatus equipped with two vertical reactors each including a stirring blade and a reflux condenser controlled to 100° C. 9,9-[4-(2-Hydroxyethoxy)phenyl]fluorene (BHEPF), isosorbide (ISB), diethylene glycol (DEG), diphenyl carbonate (DPC), and magnesium acetate tetrahydrate were loaded at a molar ratio "BHEPF/ISB/DEG/DPC/magnesium acetate" of $0.348/0.490/0.162/1.005/1.00 \times 10^{-5}$. After each of the reactors had been sufficiently purged with nitrogen (oxygen concentration: 0.0005 vol % to 0.001 vol %), a temperature in the first reactor was increased with a heating medium, and the stirring of the materials was started at the time point when the internal temperature became 100° C. 40 Minutes after the start of the temperature increase, the internal temperature was caused to reach 220° C., and such control that the temperature was held was performed. At the same time, a reduction in pressure in the first reactor was started, and the pressure was reduced to 13.3 kPa in 90 minutes after the temperature had reached 220° C. Phenol vapor produced as a by-product in association with the polymerization reaction was introduced into the reflux condenser at 100° C., a monomer component present in a slight amount in the phenol vapor was returned to the first reactor, and phenol vapor that was not condensed was introduced into a condenser at 45° C. to be recovered.

Nitrogen was introduced into the first reactor to return the pressure to atmospheric pressure once. After that, an oligomerized reaction liquid in the first reactor was transferred to the second reactor. Next, an increase in temperature in the second reactor and a reduction in pressure therein were started, and the internal temperature was increased to 240° C. and the pressure was reduced to 0.2 kPa in 50 minutes. After that, the polymerization was advanced until predetermined stirring power was obtained. At the time point when the predetermined power was achieved, nitrogen was introduced into the second reactor to return the pressure to atmospheric pressure, and the reaction liquid was extracted in the form of a strand, followed by pelletization with a rotary cutter. Thus, a polycarbonate resin having a copolymerization composition "BHEPF/ISB/DEG" of 34.8/49.0/16.2 [mol %] was obtained. The polycarbonate resin had a reduced viscosity of 0.430 dL/g and a glass transition temperature of 128° C.

An application liquid was prepared by dissolving the resultant polycarbonate resin (10 kg) in methylene chloride (73 kg). Next, the application liquid was directly applied onto a shrinkable film (longitudinally uniaxially stretched polypropylene film, manufactured by Tokyo Printing Ink Mfg. Co., Ltd., product name: "NOBLEN"), and the applied film was dried at a drying temperature of 30° C. for 5 minutes and then at a drying temperature of 80° C. for 5 minutes to form a laminate of the shrinkable film and a birefringent layer. The resultant laminate was stretched with a simultaneous biaxial stretching machine at a stretching temperature of 155° C. In its MD direction at a shrinkage ratio of 0.80 and in its TD direction at 1.3 times. Thus, a retardation film was formed on the shrinkable film. Next, the retardation film was peeled from the shrinkable film. The retardation film had a thickness of 60.0 μm, an Re (550) of 140 nm, an Nz coefficient of 0.5, and a ratio "Re(450)/Re(550)" 0.89. The retardation film was used as a second optical compensation layer.

(iii) Production of Polarizer

While an elongate roll of a polyvinyl alcohol (PVA)-based resin film having a thickness of 30 μm (manufactured by Kuraray Co., Ltd., product name: "PE3000") was uniaxially stretched with a roll stretching machine in its lengthwise direction so that a stretching ratio became 5.9 times in the lengthwise direction, the roll was simultaneously subjected to swelling, dyeing, cross-linking, and washing treatments. Finally, the roll was subjected to drying treatment to produce a polarizer having a thickness of 12 μm.

Specifically, in the swelling treatment, the roll was stretched at 2.2 times while being treated with pure water at 20° C. Next, in the dyeing treatment, the roll was stretched at 1.4 times while being treated in an aqueous solution at 30° C. In which a weight ratio between iodine and potassium iodide was 1:7, the aqueous solution having an iodine concentration adjusted so that the single layer transmittance of the polarizer to be obtained became 45.0%. Further, two-stage cross-linking treatment was adopted as the cross-linking treatment, and in the first-stage cross-linking treatment, the roll was stretched at 1.2 times while being treated in an aqueous solution at 40° C. obtained by dissolving boric acid and potassium iodide. The boric acid content and potassium iodide content of the aqueous solution in the first-stage cross-linking treatment were set to 5.0 wt % and 3.0 wt %, respectively. In the second-stage cross-linking treatment, the roll was stretched at 1.6 times while being treated in an aqueous solution at 65° C. obtained by dissolving boric acid and potassium iodide. The boric acid content and potassium iodide content of the aqueous solution in the second-stage cross-linking treatment were set to 4.3 wt % and 5.0 wt %, respectively. In addition, in the washing treatment, the roll was treated with an aqueous solution of potassium iodide at 20° C. The potassium iodide content of the aqueous solution in the washing treatment was set to 2.6 wt %. in the drying treatment, the roll was dried at 70° C. for 5 minutes to provide the polarizer.

(iv) Production of Polarizing Plate

A HC-TAC film (thickness: 32 μm, corresponding to a protective layer) having a hard coat (HC) layer formed on one surface of a TAC film by hard coat treatment was bonded to one side of the polarizer via a polyvinyl alcohol-based adhesive by a roll-to-roll process. Thus, an elongate polarizing plate having the configuration "protective layer/polarizer" was obtained.

(v) Production of Polarizing Plate with Optical Compensation Layers

The polarizing plate, the first optical compensation layer, and the second optical compensation layer obtained in the foregoing were cut into predetermined sizes. The polarizer surface of the polarizing plate and the first optical compensation layer were bonded to each other via an acrylic pressure-sensitive adhesive, and the first optical compensation layer and the second optical compensation layer were bonded to each other via an acrylic pressure-sensitive adhesive. Thus a polarizing plate with optical compensation layers having the configuration "protective layer/polarizer/first optical compensation layer/second optical compensation layer" was obtained. The cutting of the first optical compensation layer was performed so that the absorption axis of the polarizer and the slow axis of the first optical compensation layer were substantially perpendicular to each other in the polarizing plate with optical compensation layers. In addition, the cutting of the second optical compensation layer was performed so that an angle formed by the absorption axis of the polarizer and the slow axis of the second optical compensation layer became 45° in the polarizing plate with optical compensation layers.

(vi) Production of Organic EL Panel

A pressure-sensitive adhesive layer was formed on the second optical compensation layer side of the resultant polarizing plate with optical compensation layers by using an acrylic pressure-sensitive adhesive.

A smartphone Galaxy-S5) manufactured by Samsung Electronics Co., Ltd. was dismantled, and its organic EL panel was taken out. A polarizing film bonded to the organic EL panel was peeled off, and the polarizing plate with optical compensation layers cut out in the foregoing was bonded instead to the remainder. Thus, an organic EL panel was obtained.

The simulation of reflection characteristics described in the (3) was performed by using the characteristics of the resultant polarizing plate with optical compensation layers. The results are shown in Table 1.

Example 2

A polarizing plate with optical compensation, layers having the configuration "protective layer/polarizer/first optical compensation layer/second optical compensation layer" was obtained in the same manner as in Example 1 except that: a retardation film of a polycarbonate-based resin obtained as described below was used as the first optical compensation layer; and the polarizer and the first optical compensation layer were bonded to each other so that the absorption axis of the polarizer and the slow axis of the first optical compensation layer were substantially parallel to each other Further, an organic EL panel was produced in the same manner as in Example 1 except that the polarizing plate with optical compensation layers was used. The polarizing plate with optical compensation layers and the organic EL panel thus obtained were subjected to the same evaluations as those of Example 1. The results are shown in Table 1.

Phosgene serving as a carbonate precursor, and (A) (2,2-bis(4-hydroxyphenyl) propane and (B) 1,1-bis(4-hydroxyphenyl)-3,3,5-trimethylcyclohexane each serving as an aromatic dihydric phenol component were used to provide a polycarbonate-based resin [number-average molecular weight (Mn)=33,000, Mw/Mn=1.78] having a weight ratio "(A):(B)" of 4:6 and a weight-average molecular weight (Mw) of 60,000, and containing repeating units represented by the below-indicated formulae (3) and (4) in accordance with an ordinary method. 70 Parts by weight of the polycarbonate-based resin and 30 parts by weight of a styrene-based resin having a weight-average molecular weight (Mw) of 1,300 [number-average molecular weight (Mn)=716, Mw/Mn=1.78] (HIMER SB75 manufactured by Sanyo Chemical Industries, Ltd.) were added to 300 parts by weight of dichloromethane, and the materials were stirred and mixed under room temperature for 4 hours to provide a transparent solution. The solution was cast onto a glass plate and left to stand at room temperature for 15 minutes. After that, the resultant was peeled from the glass plate, and was dried in an oven at 80° C. for 10 minutes and then at 120° C. for 20 minutes to provide a polymer film having a thickness of 36 μm and a glass transition temperature (Tg) of 140° C. The light transmittance of the resultant polymer film at a wavelength of 590 nm was 93%. In addition, the polymer film had an in-plane retardation value Re (590) of 5.0 nm, a thickness direction retardation value Rth(590) of 12.0 nm, and an average refractive index of 1.576.

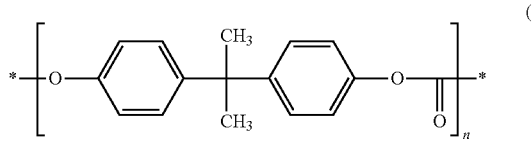

(3)

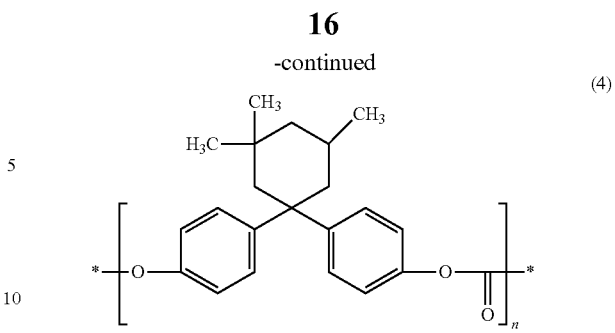

(4)

Biaxially stretched polypropylene films [manufactured by Toray industries, Inc., product name: "TORAYFAN" (thickness: 60 μm)] were bonded to both sides of the polymer film (thickness: 36 μm) via acrylic pressure-sensitive adhesive layers (thickness: 15 μm). After that, the laminated film was stretched in an air circulation-type thermostatic oven at 147° C. at 1.49 times with its lengthwise direction held with a roll stretching machine. The resultant retardation film had a thickness of 40 μm, an Re(550) of 270 nm, and an Nz coefficient of 0.75.

Example 3

A polarizing plate with optical compensation layers having the configuration "protective layer/polarizer/first optical compensation layer/second optical compensation layer" was obtained in the same manner as in Example 1 except that a retardation film of a cellulose acetate resin obtained as described below was used as the second optical compensation layer. Further, an organic EL panel was produced in the same manner as in Example 1 except that the polarizing plate with optical compensation layers was used. The polarizing plate with optical compensation layers and the organic EL panel thus obtained were subjected to the same evaluations as those of Example 1. The results are shown in Table 1.

Shrinkable films having the same size (biaxially stretched films of PP, thickness: 60 μm) were bonded to both surfaces of a cellulose acetate resin film (220×120 mm, thickness: 50 μm) with acrylic pressure-sensitive adhesives. Thus, a laminate was obtained. After that, the cellulose acetate resin film was shrunk by shrinking the laminate with a batch-type simultaneous biaxial stretching machine at 120° C. so that its size became 0.7 times as large as its original size. At the same time, the laminate was stretched in a direction perpendicular to the direction in which the cellulose acetate resin film was shrunk at 2.0 times to form birefringent layers. Next, the birefringent layer was separated from the shrinkable films. The birefringent layer had a thickness of 50 μm, an Re (550) of 140 nm, an Nz coefficient of 0.5, and a ratio "Re(450)/Re(550)" of 0.93. The resultant retardation film was used as a second optical compensation layer.

Comparative Example 1

A polarizing plate with an optical compensation layer having the configuration "protective layer/polarizer/first optical compensation layer" was obtained in the same manner as in Example 1 except that the second optical compensation layer was not laminated. Further, an organic EL panel was produced in the same manner as in Example 1 except that the polarizing plate with an optical compensation layer was used. The polarizing plate with an optical compensation layer and the organic EL panel thus obtained were subjected to the same evaluations as those of Example 1. The results are shown in Table 1.

Comparative Example 2

A polarizing plate with an optical compensation layer having the configuration "protective layer /polarizer/second optical compensation layer" was obtained in the same manner as in Example 1 except that the first optical compensation layer was not laminated. Further, an organic EL panel was produced in the same manner as in Example 1 except that the polarizing plate with an optical compensation layer was used. The polarizing plate with an optical compensation layer and the organic EL panel thus obtained were subjected to the same evaluations as those of Example 1. The results are shown in Table 1.

Comparative Example 3

A commercially available cycloolefin-based film (manufactured b JSR Corporation, product name: "ARTON") was subjected to shrinking treatment to provide a retardation film showing a refractive index characteristic of nx>nz>ny, and having a ratio "Re (450)/Re (550)" of 1.00 and an Re, (550) of 140 nm. A polarizing plate with optical compensation layers having the configuration "protective layer/polarizer/first optical compensation layer/second optical compensation layer" was obtained in the same manner as in Example 1 except that the retardation film was used as the second optical compensation layer. Further, an organic EL panel was produced in the same manner as in Example 1 except that the polarizing plate with optical compensation layers was used. The polarizing plate with optical compensation layers and the organic EL panel thus obtained were subjected to the same evaluations as those of Example 1. The results are shown in Table 1.

Comparative Example 4

The polycarbonate film used in Example 2 was subjected to free-end stretching to provide a retardation film having an Re (550) of 270 nm and an Nz coefficient of 1.0 (nx>ny=nz). A polarizing plate with optical compensation layers having the configuration "protective layer: polarizer/first optical compensation layer/second optical compensation layer" was obtained in the same manner as in Example 1 except that the retardation film was used as the first optical compensation layer. Further, an organic EL panel was produced in the same manner as in Example 1 except that the polarizing plate with optical compensation layers was used. The polarizing plate with optical compensation layers and the organic EL panel thus obtained were subjected to the same evaluations as those of Example 1. The results are shown in Table 1.

TABLE 1

| | First optical compensation layer | | | | Second optical compensation layer | | | | | Simulation | |
|---|---|---|---|---|---|---|---|---|---|---|---|
| | Re | Rth | Nz | Absorption axis of polarizer and slow axis | Re | Rth | Nz | Re450/Re550 | Axis angle | Front reflection intensity | Front reflection hue Δu 'v' (neutral) |
| Example 1 | 270 | 68 | 0.25 | Perpendicular | 140 | 70 | 0.5 | 0.89 | 45 | 0.12 | 0.22 |
| Example 2 | 270 | 202 | 0.75 | Parallel | 140 | 70 | 0.5 | 0.89 | 45 | 0.29 | 0.09 |
| Example 3 | 270 | 68 | 0.25 | Perpendicular | 140 | 70 | 0.5 | 0.93 | 45 | 0.26 | 0.25 |
| Comparative Example 1 | 270 | 68 | 0.25 | Perpendicular | — | — | — | — | — | 33.77 | 0.005 |
| Comparative Example 2 | — | — | — | — | 140 | 70 | 0.5 | 0.89 | 45 | 0.36 | 0.29 |
| Comparative Example 3 | 270 | 68 | 0.25 | Perpendicular | 140 | 70 | 0.5 | 1.00 | 45 | 0.43 | 0.26 |
| Comparative Example 4 | 270 | 270 | 1.0 | Parallel | 140 | 70 | 0.5 | 0.89 | 45 | 0.36 | 0.09 |

| | Simulation | | Organic EL panel | | | |
|---|---|---|---|---|---|---|
| | Oblique reflection intensity | Oblique reflection hue Δu 'v' | Front reflection intensity | Front reflection hue | Oblique reflection intensity | Oblique reflection hue |
| Example 1 | 0.07 | 0.27 | ○ | ○ | ○ | ○ |
| Example 2 | 0.27 | 0.16 | ○ | ○ | ○ | ○ |
| Example 3 | 0.18 | 0.13 | ○ | ○ | ○ | ○ |
| Comparative Example 1 | 14.72 | 0.001 | x | ○ | x | ○ |
| Comparative Example 2 | 0.87 | 0.20 | x | ○ | x | ○ |
| Comparative Example 3 | 0.19 | 0.057 | x | ○ | ○ | ○ |
| Comparative Example 4 | 0.09 | 0.13 | x | ○ | ○ | ○ |

[Evaluation]

As is apparent from Table 1, the polarizing plate with optical compensation layers of each of Examples of the present invention can be excellent in antireflection characteristic in the oblique direction while maintaining an excellent antireflection characteristic in the front direction, and its hue in the oblique direction can be neutralized.

INDUSTRIAL APPLICABILITY

The polarizing plate with optical compensation layers present invention is suitably used for an organic EL panel

REFERENCE SIGNS LIST

10 polarizer
20 protective layer
30 first optical compensation layer
40 second optical compensation layer
100 polarizing plate with optical compensation layers

The invention claimed is:

1. A polarizing plate with optical compensation layers, comprising in the following order:
   a polarizer;
   a first optical compensation layer; and
   a second optical compensation layer,
   wherein the first optical compensation layer shows a refractive index characteristic of nx>nz>ny and has an Re(550) of from 230 nm to 310 nm,
   wherein the second optical compensation layer shows a refractive index characteristic of nx>nz>ny and satisfies a relationship of Re(450)<Re(550), and
   wherein the polarizing plate with optical compensation layers is used in an organic EL panel,
   where Re(450) and Re(550) represent in-plane retardations measured at 23° C. with light having a wavelength of 450 nm and light having a wavelength of 550 nm, respectively.

2. The polarizing plate with optical compensation layers according to claim 1,
   wherein the first optical compensation layer has an Nz coefficient of from 0.1 to 0.4,
   wherein an absorption axis direction of the polarizer and a slow axis direction of the first optical compensation layer are substantially perpendicular to each other, and
   wherein an angle formed by an absorption axis of the polarizer and a slow axis of the second optical compensation layer is from 35° to 55°.

3. The polarizing plate with optical compensation layers according to claim 1,
   wherein the first optical compensation layer has an Nz coefficient of from 0.6 to 0.9,
   wherein an absorption axis direction of the polarizer and a slow axis direction of the first optical compensation layer are substantially parallel to each other, and
   wherein an angle formed by an absorption axis of the polarizer and a slow axis of the second optical compensation layer is from 35° to 55°.

4. The polarizing plate with optical compensation layers according to claim 1, wherein the second optical compensation layer has an Re(550) of from 100 nm to 180 nm and an Nz coefficient of from 0.3 to 0.7.

5. An organic EL panel, comprising the polarizing plate with optical compensation layers of claim 1.

6. A polarizing plate with optical compensation layers, comprising in the following order:
   a polarizer;
   a first optical compensation layer; and
   a second optical compensation layer,
   wherein the first optical compensation layer shows a refractive index characteristic of nx>nz>ny, and has an Re(550) of from 230 nm to 310 nm and an Nz coefficient of from 0.1 to 0.4,
   wherein the second optical compensation layer shows a refractive index characteristic of nx>nz>ny, has an Re(550) of from 100 nm to 180 nm and an Nz coefficient of from 0.3 to 0.7, and satisfies a relationship of Re(450)<Re(550),
   wherein an absorption axis direction of the polarizer and a slow axis direction of the first optical compensation layer are substantially perpendicular to each other, and
   wherein an angle formed by an absorption axis of the polarizer and a slow axis of the second optical compensation layer is from 35° to 55°,
   where Re(450) and Re(550) represent in-plane retardations measured at 23° C. with light having a wavelength of 450 nm and light having a wavelength of 550 nm, respectively.

7. A polarizing plate with optical compensation layers, comprising in the following order:
   a polarizer;
   a first optical compensation layer; and
   a second optical compensation layer,
   wherein the first optical compensation layer shows a refractive index characteristic of nx>nz>ny, and has an Re(550) of from 230 nm to 310 nm and an Nz coefficient of from 0.6 to 0.9,
   wherein the second optical compensation layer shows a refractive index characteristic of nx>nz>ny, has an Re(550) of from 100 nm to 180 nm and an Nz coefficient of from 0.3 to 0.7, and satisfies a relationship of Re(450)<Re(550),
   wherein an absorption axis direction of the polarizer and a slow axis direction of the first optical compensation layer are substantially parallel to each other, and
   wherein an angle formed by an absorption axis of the polarizer and a slow axis of the second optical compensation layer is from 35° to 55°,
   where Re(450) and Re(550) represent in-plane retardations measured at 23° C. with light having a wavelength of 450 nm and light having a wavelength of 550 nm, respectively.

8. An organic EL panel, comprising the polarizing plate with optical compensation layers of claim 6.

9. An organic EL panel, comprising the polarizing plate with optical compensation layers of claim 7.

* * * * *